(12) United States Patent
Nishimura et al.

(10) Patent No.: US 7,049,692 B2
(45) Date of Patent: May 23, 2006

(54) STACKED SEMICONDUCTOR DEVICE

(75) Inventors: Takao Nishimura, Kawasaki (JP); Kazuyuki Aiba, Kawasaki (JP); Akira Takashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 10/763,267

(22) Filed: Jan. 26, 2004

(65) Prior Publication Data

US 2004/0178508 A1   Sep. 16, 2004

(30) Foreign Application Priority Data

Mar. 11, 2003   (JP)   ............... 2003-065392

(51) Int. Cl.
   *H01L 23/02* (2006.01)
(52) U.S. Cl. .................. 257/686; 257/723; 257/737
(58) Field of Classification Search ................ 257/778, 257/737, 686, 685, 723
   See application file for complete search history.

(56) References Cited

U.S. PATENT DOCUMENTS 5,594,275 A * 1/1997 Kwon et al. ................ 257/686

FOREIGN PATENT DOCUMENTS

| JP | 6-252334 | 9/1994 |
|---|---|---|
| JP | 11 260999 | 9/1999 |
| JP | 2001 358248 | 12/2001 |
| JP | 2002-158312 | 5/2002 |

* cited by examiner

*Primary Examiner*—Roy Potter
(74) *Attorney, Agent, or Firm*—Westerman, Hattori, Daniels & Adrian, LLP

(57) ABSTRACT

A stacked semiconductor device is disclosed that has a three-dimensional structure using general-purpose semiconductor device units (semiconductor devices) that are stacked with an interposer substrate being provided between an upper device unit and a lower device unit. The upper device unit includes a semiconductor device, a first wiring substrate, and an external connection terminal. The lower device unit includes a semiconductor device, a second wiring substrate, and a connection electrode that is prepared on the upper surface of the second wiring substrate. The interposer substrate includes a circuit board, a first conductive material connecting to the connection electrode, a second conductive material formed in a form position of the external connection terminal that is electrically connected to the second conductive material, and a third conductive material for electrically connecting the first conductive material and the second conductive material.

9 Claims, 7 Drawing Sheets

STACKED SEMICONDUCTOR DEVICE

BACKGROUND OF THE INVENTION

1. Field of the Invention

The present invention generally relates to a stacked semiconductor device, and especially relates to a stacked semiconductor device having a three-dimensional structure wherein two or more semiconductor device units and semiconductor devices are stacked.

With advancement of electronic apparatuses in recent years, semiconductor devices used therein are increasingly required to be small in size, thin, capable of providing multiple functions and advanced features, and highly condensed. In order to meet such requirements, the packaging structure of semiconductor devices is shifting to a three-dimensional structure wherein two or more semiconductor device units or two or more semiconductor devices are stacked.

2. Description of the Related Art

Conventionally, semiconductor devices with three-dimensional structures containing two or more semiconductor device units have been disclosed as JPL, 06-252334 (pp. 3 through 7, FIG. 1) (patent reference 1) and JPL, 2002-158312 (pp. 3 through 7, FIG. 1) (patent reference 2) indicate. Here, a semiconductor device unit means a semiconductor device as it is, and a structure containing a semiconductor device in a package. The patent reference 1 discloses a QFP (quad flat package) that employs a leadframe as an external terminal. A QFP type semiconductor device provides a terminal on the upper part of the package by forming a convex section by deforming an inner lead section of the leadframe, on which package a stacking wiring substrate having terminals on both upper and bottom surfaces of the package is connected by a solder bump.

In the case of the patent reference 2, a semiconductor device is disclosed wherein a plurality of molding-sealed semiconductor units are stacked. Here, penetration wiring is provided on the semiconductor device at the molding-seal section of the semiconductor device units such that a terminal is provided at the upper part of the package, at which upper part of the package a re-wiring substrate having a terminal on both upper and bottom surfaces is connected by a solder ball.

Nevertheless, according to the semiconductor device disclosed by the patent reference 1, problems are that no more than one semiconductor device unit can be stacked beneath (i.e., two in total), and that a terminal has to be prepared at the upper part of the package by deforming a leadframe, requiring considerable manufacturing processes, with manufacturing cost becoming high.

According to the semiconductor device disclosed by the patent reference 2, problems are that the stacked end product becomes thick since each semiconductor device unit is molded, and considerable manufacturing processes are required in order to form the penetration wiring, raising manufacturing cost.

Further, in the semiconductor devices as disclosed by the patent references 1 and 2 wherein two or more semiconductor device units are stacked into a three-dimensional structure, it is necessary to set up so as to arrange external connection terminals of each semiconductor device unit such that stacking is possible. This may not pose a problem if the semiconductor device units are newly designed, manufactured, tested, and then stacked. However, there are cases where employing general-purpose semiconductor device units is desired from the economical point of view, given that the general-purpose semiconductor device units have passed tests and are guaranteed for proper operation. In this case, a problem is in that the external connection terminals of each semiconductor device unit are not necessarily set up such that stacking can be carried out.

SUMMARY OF THE INVENTION

An aspect of the present invention is to provide a stacked semiconductor device that includes:

a first semiconductor device unit that has a first wiring substrate, at least one semiconductor device being mounted on the first wiring substrate, and an external connection terminal, a second semiconductor device unit that has a second wiring substrate installed below the first semiconductor device unit, at least one semiconductor device being mounted on the second wiring substrate, and a connection electrode being formed on a surface of the second wiring substrate, the surface facing the first semiconductor device unit, and a third wiring substrate that includes a circuit board arranged between the first semiconductor device unit and the second semiconductor device unit, a first conductive member that is electrically connected to the above-mentioned connection electrode, a second conductive member that is formed corresponding to the form position of the above-mentioned external connection terminal, and electrically connected to the external connection terminal, and a third conductive member that connects the first conductive member and the second conductive member.

Another aspect of the present invention is to provide a stacked semiconductor device wherein the first conductive member is constituted by a solder bump that is formed by penetrating the circuit board, and connected to the third conductive member.

Further, another aspect of the present invention is to provide a stacked semiconductor device wherein:

the first conductive member is constituted by the solder bump as described above, the second conductive member and the third conductive member are formed on a surface of the third wiring substrate, the surface facing the above second wiring substrate, and a through hole is formed in the third wiring substrate for electrically connecting the external connection terminal with the second conductive member.

Further still, another aspect of the present invention is to provide a stacked semiconductor device wherein the second conductive member and the third conductive member are formed on both surfaces of the third wiring substrate, one of the surfaces facing the first semiconductor device unit, and the other surface facing the second semiconductor device unit, wherein the third conductive member formed on both surfaces is electrically connected by the through-hole electrodes formed by penetrating the circuit board.

Further still, another aspect of the present invention is to provide a stacked semiconductor device wherein the first semiconductor unit includes two or more semiconductor device units that are stacked.

Further still, another aspect of the present invention is to provide a stacked semiconductor device wherein the second semiconductor device unit includes two or more semiconductor device units that are stacked.

Further still, another aspect of the present invention is to provide a stacked semiconductor device wherein the third wiring substrate is a multilayered substrate.

Further still, another aspect of the present invention is to provide a stacked semiconductor device wherein a passive component is provided on the third wiring substrate.

Further still, another aspect of the present invention is to provide a stacked semiconductor device wherein a multi-layered substrate is used as the third wiring substrate, and a passive component is prepared in the multilayered substrate.

Accordingly, the present invention provides a stacked semiconductor device that substantially obviates one or more of the problems caused by the limitations and disadvantages of the related art.

DESCRIPTION OF THE PREFERRED EMBODIMENTS

In the following, embodiments of the present invention are described with reference to the accompanying drawings.

Figure 1:
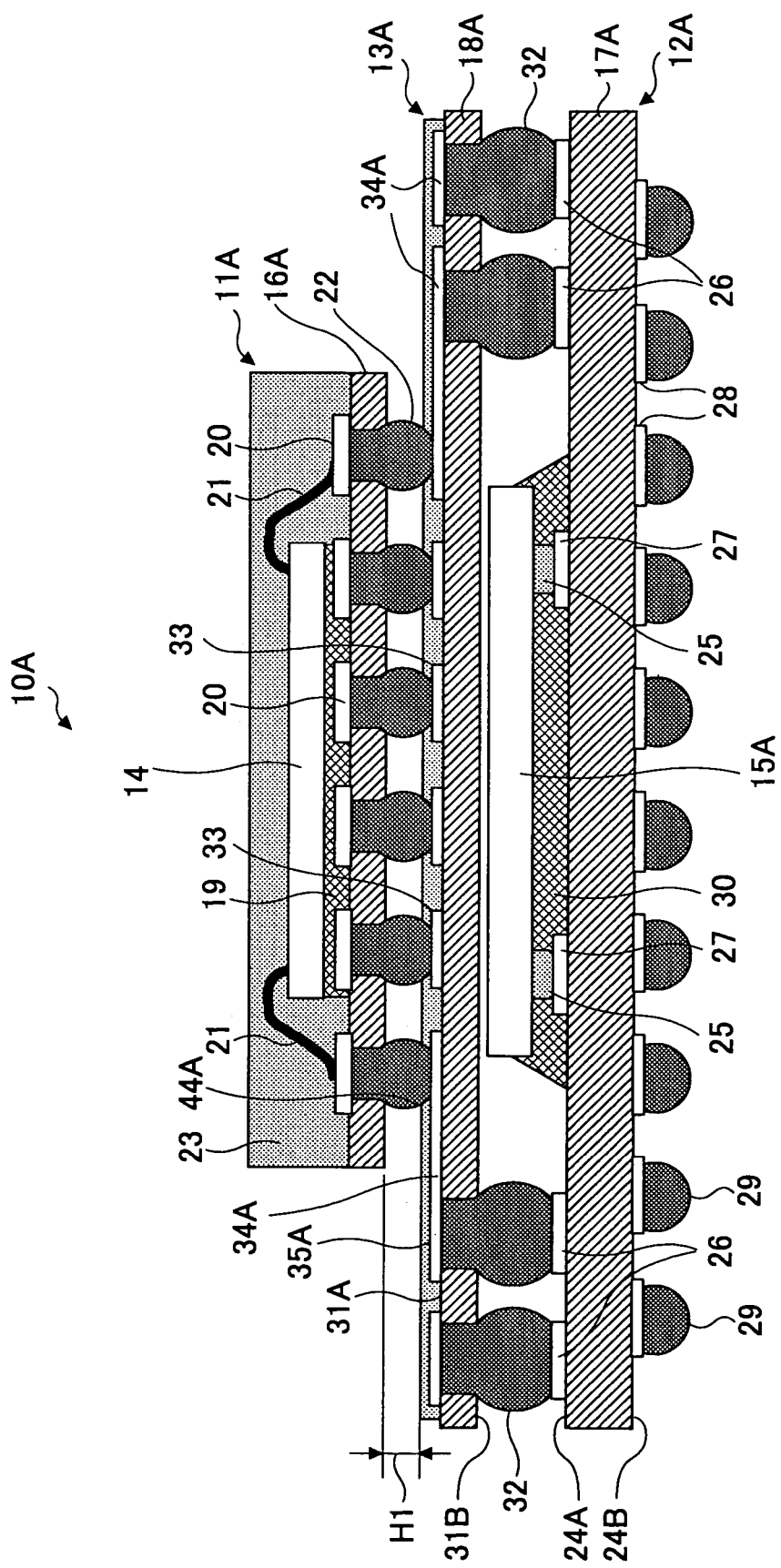
FIG. 1 is a cross-sectional view of a semiconductor device according to a first embodiment of the present invention.

FIG. 1 shows a stacked semiconductor device (henceforth referred to as "semiconductor device") 10A according to the first embodiment of the present invention. The semiconductor device 10A includes an upper semiconductor device unit 11A (henceforth called "upper device unit"), a lower semiconductor device unit 12A (henceforth called "lower device unit"), and an interposer substrate 13A.

The upper device unit 11A is a general-purpose semiconductor device that is commercially available. That is, a commercial product that is guaranteed by a manufacturer is used as the upper device unit 11A.

Further, the device unit 11A is a BGA (Ball Grid Array) type semiconductor device wherein a semiconductor element 14A is mounted on the upper surface of a first wiring substrate 16A, and external connection terminals 22 are arranged on the undersurface of the first wiring substrate 16A. A solder ball constitutes each of the external connection terminals 22.

According to the present embodiment, the semiconductor element 14A is fixed with its face up on the first wiring substrate 16A. Further, electrode pads 20 are formed on the first wiring substrate 16A, and the semiconductor element 14A is connected to the electrode pads 20 by wires 21.

Further, the external connection terminals 22 are connected to the electrode pads 20 by through holes formed in the first wiring substrate 16A. Therefore, the semiconductor element 14A is electrically connected to the external connection terminals 22 through the wires 21 and the electrode pads 20. Further, a sealing resin 23 is formed covering the whole upper surface of the first wiring substrate 16A such that the semiconductor element 14A, the wires 21, and others are protected.

The lower device unit 12A includes a semiconductor element 15A, a second wiring substrate 17A, and external connection terminals 29.

The semiconductor element 15A is mounted on the second wiring substrate 17A by flip chip bonding. That is, bumps 25 are beforehand formed in an electrode section (not shown) of the circuit surface of the semiconductor element 15A, and the semiconductor element 15A is electrically connected to the second wiring substrate 17A by connecting the bumps 25 to bump connecting electrodes 27 formed on an upper surface 24A of the second wiring substrate 17A. Further, in order to strengthen the connections between the bumps 25 and the bump connecting electrodes 27, an underfill resin 30 is arranged between the semiconductor element 15A and the second wiring substrate 17A.

The second wiring substrate 17A is located below the upper device unit 11A. That is, the lower device unit 12A is arranged below the upper device unit 11A.

On the undersurface 24B of the second wiring substrate 17A, two or more lower electrodes 28 are formed, and external connection terminals 29 are bonded to the lower electrodes 28. The external connection terminals 29 are the terminals that are connected to an external substrate when the semiconductor device 10A is mounted on the external substrate. Further, the lower electrodes 28 to which the external connection terminals 29 are connected are also connected to the connection electrodes 26, or, as applicable, to the bump connecting electrodes 27 by an inner layer wiring (not shown) prepared inside the second wiring substrate 17A.

The interposer substrate 13A includes first conductive members 32, as described below, which are connected to the connection electrodes 26 that are formed on the upper surface 24A of the second wiring substrate 17A. Further, the connection electrodes 26 are prepared at positions where the semiconductor element 15A is not mounted.

The interposer substrate 13A includes a circuit board 18A, the first conductive members 32, second conductive members 33, and third conductive members 34A.

The circuit board 18A is arranged between the upper device unit 11A and the lower device unit 12A. In other words, the interposer substrate 13A is arranged between the upper device unit 11A and the lower device unit 12A. The circuit board 18A is a single surface wiring substrate made of epoxy/glass or BT (Bismaleimide Triazine)/glass, on an upper surface 31A of which the second conductive members 33 serving as electrodes, and the third conductive members 34A serving as a wiring section, are formed.

The first conductive members 32 are constituted by solder bumps, and are connected to the third conductive members 34A via through holes prepared in the interposer substrate 13A. The first conductive members 32 electrically connect the lower device unit 12A to the interposer substrate 13A. In this manner, the lower device unit 12A and the interposer substrate 13A are electrically connected by the first conductive members 32 that are constituted by the solder bumps, which are easy and economical to prepare. Further, a process for stacking the lower device unit 12A and the interposer substrate 13A becomes simple and economical.

Further, the second conductive members 33 and the third conductive members 34A, being structured as printed circuits made of copper, are formed on the upper surface 31A of the circuit board 18A. Further, the second conductive members 33 and the third conductive members 34A are protected by a protective coat 35A formed on the upper surface 31A of the circuit board 18A. Openings 44 are formed in the protective coat 35A at positions corresponding to the external connection terminals 22 of the upper device unit 11A.

The second conductive members 33 are connected to the external connection terminals 22 of the upper device unit 11A. The third conductive members 34A electrically connect the first conductive members 32 and the second conductive members 33.

Accordingly, the external connection terminals 22 of the upper device unit 11A and the connection electrodes 26 of the lower device unit 12A are electrically connected by the first conductive members 32, the second conductive members 33, and the third conductive members 34A. In this manner, the upper device unit 11A and the lower device unit 12A stacked with the interposer substrate 13A in the middle constitute the semiconductor device 10A, wherein the interposer substrate 13A functions as an interposer for electrically connecting the upper device unit 11A and the lower device unit 12A.

According to the semiconductor device 10A structured as mentioned above, the second conductive members 33 are formed corresponding to the form positions of the external connection terminals 22 of the upper device unit 11A, and there are no other restrictions as to the form positions of the second conductive members 33. That is, the second conductive members 33 can be arranged on the upper surface 31A of the circuit board 18A according to the arrangement of the external connection terminals 22. For this reason, a general-purpose semiconductor device, wherein the arrangement of the external connection terminals 22 is beforehand defined can be used as the upper device unit 11A.

As described above, the yield of an end product, such as the semiconductor device 10A, constituted by multiple semiconductor device units (semiconductor device) is an accumulation of the yields of the multiple semiconductor devices, such as the upper device unit 11A and the lower device unit 12A, when the yield is determined after assembling the multiple semiconductor devices. However, since the semiconductor device 10A according to the present embodiment uses a general-purpose semiconductor device, the quality of which is guaranteed, as the semiconductor device unit 11A, the manufacturing yield of the whole semiconductor device 10A is improved.

Further, according to the semiconductor device 10A of the present embodiment, since the second conductive members 33 are formed corresponding to the upper device unit 11A, the design flexibility is enhanced. Furthermore, the design flexibility of the third conductive members 34A formed on the upper surface 31A of the circuit board 18A is also enhanced. In this manner, the wiring structure, which can otherwise become complicated due to stacking, becomes simple, facilitating design of the semiconductor device 10A, and the semiconductor device 10A that is capable of offering advanced features and multiple functions is realized.

In addition, although not illustrated, it is also possible to apply an adhesive to gaps between the substrates 16A, 17A, and 13A, except for sections where the electrical connections are prepared (an example in reference to the present embodiment is the gap between the non-circuit surface (upper surface) of the semiconductor element 15A and the circuit board 18A). This matter is also applicable to the other embodiments, descriptions of which follow.

Next, the second embodiment of the present invention is explained.

Figure 2:
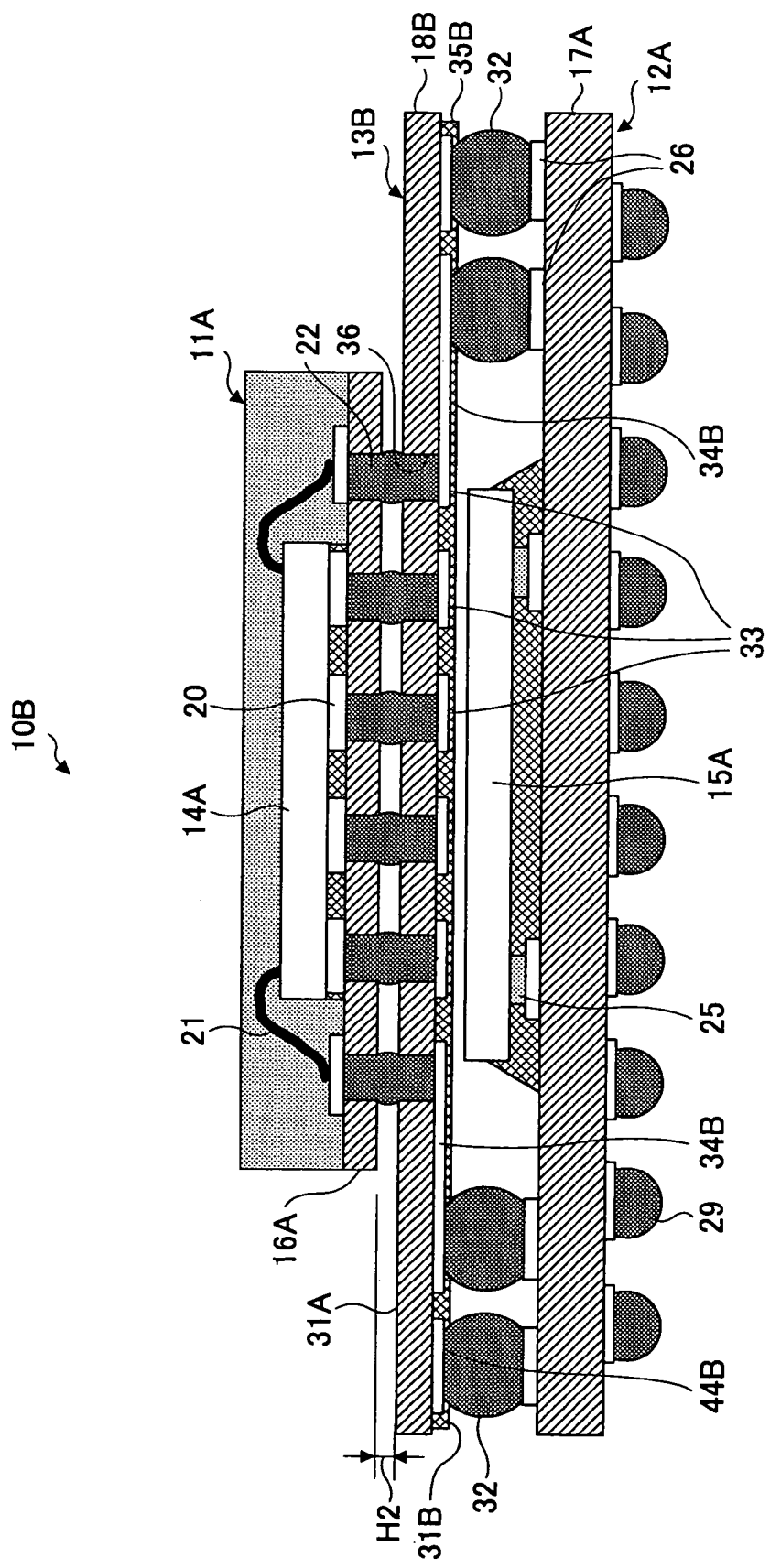
FIG. 2 is a cross-sectional view of the semiconductor device according to a second embodiment of the present invention.

FIG. 2 shows a semiconductor device 10B according to the second embodiment of the present invention. In FIG. 2 that is for explaining the second embodiment and FIGS. 3 through 7 that are for explaining subsequent embodiments, the same label is used for the same component as shown in FIG. 1, and explanation thereof is not repeated.

The semiconductor device 10B of the present embodiment includes the upper device unit 11A and the lower device unit 12A, which are the same as in the semiconductor device 10A of the first embodiment. However, the semiconductor device 10B of the present embodiment includes an interposer substrate 13B that is different from the interposer substrate 13A of the first embodiment. In the case of the interposer substrate 13A of the first embodiment, both second conductive members 33 and third conductive members 34A are formed on the upper surface 31A of the circuit board 18A. Conversely, in the case of the interposer substrate 13B of the present embodiment, the second conductive members 33 and third conductive members 34B are formed on an undersurface 31B of a circuit board 18B.

The undersurface 31B of the circuit board 18B is the surface that faces the lower device unit 12A. That is, the structure of the semiconductor device 10B of the present embodiment is such that the second conductive members 33 and the third conductive members 34 are formed on the surface of the circuit board 18B that faces the lower device unit 12A, namely the undersurface 31B.

Further, the second conductive members 33 and the third conductive members 34B formed on the undersurface 31B of the circuit board 18B are protected by a protective coat 35B formed on the undersurface 31B of the circuit board 18B. Further, openings 44B are formed in the protective coat 35B at positions corresponding to the connection electrodes 26 of the lower device unit 12A. The first conductive members 32 and the third conductive members 34B are connected through the openings 44B.

Further, the external connection terminals 22 of the upper device unit 11A are connected to the second conductive members 33 of the interposer substrate 13B via through holes 36 formed in the circuit board 18B corresponding to the form positions of the external connection terminals 22 of the upper device unit 11A. In this manner, the external connection terminals 22 are electrically connected to the second conductive members 33 via the through holes 36.

Specifically, since the external connection terminals 22 are constituted by solder balls as described above, the external connection terminals 22 are fused by heat-treatment carried out when mounting the upper device unit 11A on the interposer substrate 13B, and flow into respective through holes 36. In this manner, the external connection terminals 22 and the second conductive member 33s are electrically connected via the through holes 36.

Thus, a portion of each of the external connection terminals 22 of the semiconductor device 10B of the present embodiment is melted and fills the corresponding through hole 36 formed on the circuit board 18B. That is, the distance between the upper device unit 11A and the interposer substrate 13B becomes smaller by the height corresponding to the amount of the external connection terminals 22 that melts and fills the respective through holes 36.

Specifically, a distance H1 between the upper device unit 11A and the interposer substrate 13A of the semiconductor device 10A according to the first embodiment as shown in a FIG. 1 is made smaller in the case of the semiconductor device 10B of the present embodiment as indicated by arrows associated to a distance H2 shown in FIG. 2. In other words, the distance H2 between the upper device unit 11A and the interposer substrate 13B is less than the distance H1 by the amount that the external connection terminals 22 melt and flow into the corresponding through holes 36. In this manner, the semiconductor device 10B of the present embodiment can be made thinner compared with the semiconductor device 10A of the first embodiment.

Next, the third embodiment of the present invention is explained.

Figure 3:
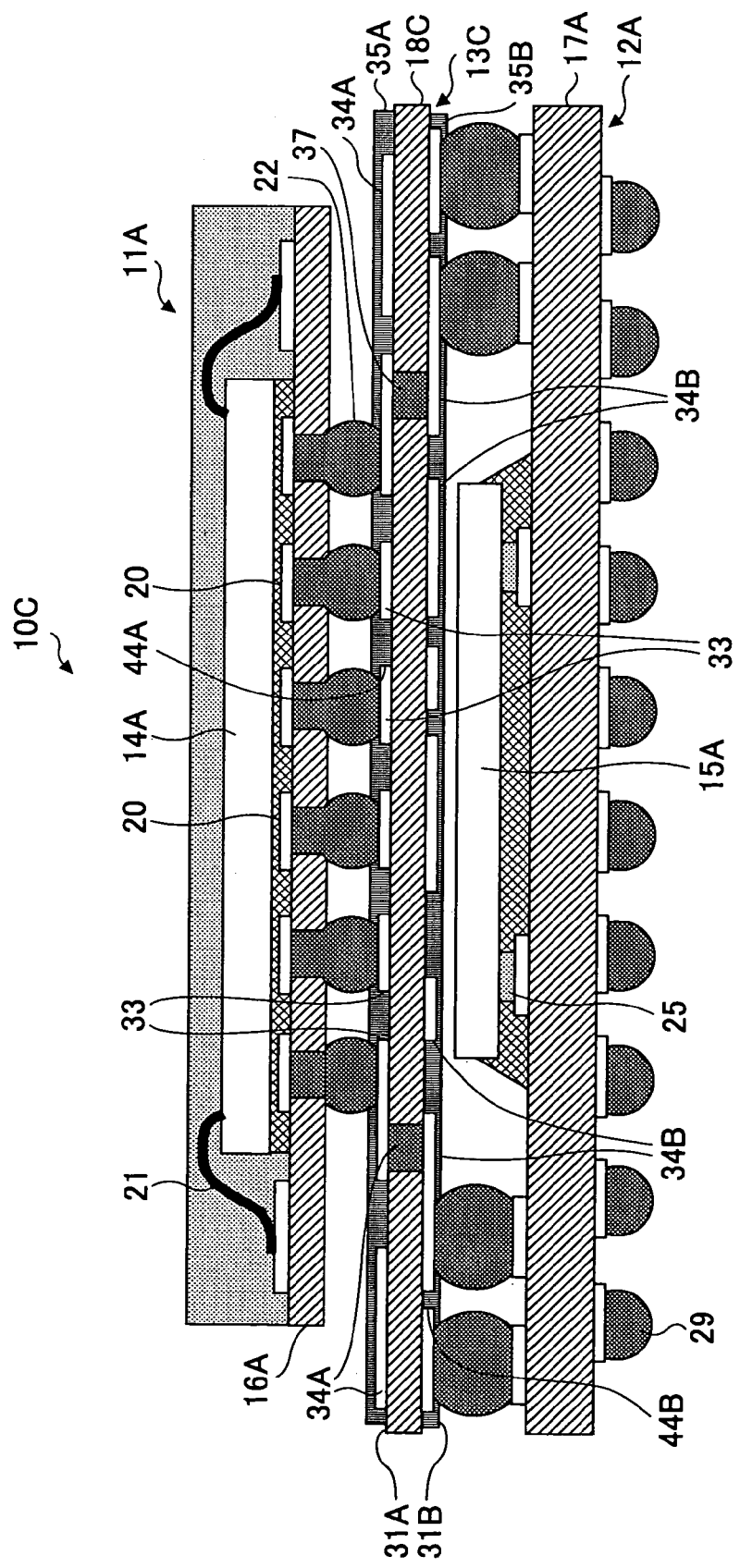
FIG. 3 is a cross-sectional view of the semiconductor device according to a third embodiment of the present invention.

FIG. 3 shows a semiconductor device 10C according to the third embodiment of the present invention. The semiconductor device 10C includes the upper device unit 11A and the lower device unit 12A, which are the same as in the semiconductor device 10A of the first embodiment. However, an interposer substrate 13C of the semiconductor device 10C is different from the first and the second embodiments.

In the cases of the interposer substrates 13A and 13B, the third conductive members 34A and 34B, respectively, are provided on the upper surface 31A and the undersurface 31B, respectively, of the circuit board 18A and 18B, respectively, i.e., only on one of the surfaces.

Conversely, in the case of the interposer substrate 13C of the present embodiment, the third conductive members 34A and 34B are provided on upper surface 31A and undersurface 31B, respectively. Specifically, the third conductive members 34A and the second conductive members 33 that are bonded to the external connection terminals 22 are provided on the upper surface 31A of the circuit board 18C, and the third conductive members 34B are formed on the undersurface 31B of the circuit board 18C. In addition, the protective coats 35A and 35B are formed on the third conductive members 34A and 34B, respectively.

Further, the openings 44A are formed in the protective coat 35A at positions corresponding to the external connection terminals 22 of the upper device unit 11A, and the openings 44B are formed in the protective coat 35B at positions corresponding to the connection electrodes 26 of the lower device unit 12A.

Further, through-hole electrodes 37 penetrating the circuit board 18C are formed, which electrically connect the third conductive members 34A formed on the upper surface 31A of the circuit board 18C and the third conductive members 34B formed on the undersurface 31B. The through-hole electrodes 37 are formed by through holes in the circuit board 18C, the through holes being filled with copper, and constituting vias.

Since the third conductive members 34A and 34B are formed on both surfaces of the circuit board 18C of the interposer substrate 13C according to the semiconductor device 10C of the present embodiment, a complicated circuit pattern can be accommodated, enhancing design flexibility, compared with a configuration wherein the third conductive members 34A or 34B, as applicable, are provided only on one of the surfaces. Further, the third conductive members 34A and 34B function as reinforcing materials, and the rigidity of the interposer substrate 13C is increased, suppressing curvature and deformation of the substrate due to temperature change. Accordingly, the manufacturing yield is raised, and the reliability of the semiconductor device 10C is improved.

Next, the fourth embodiment of the present invention is explained.

Figure 4:
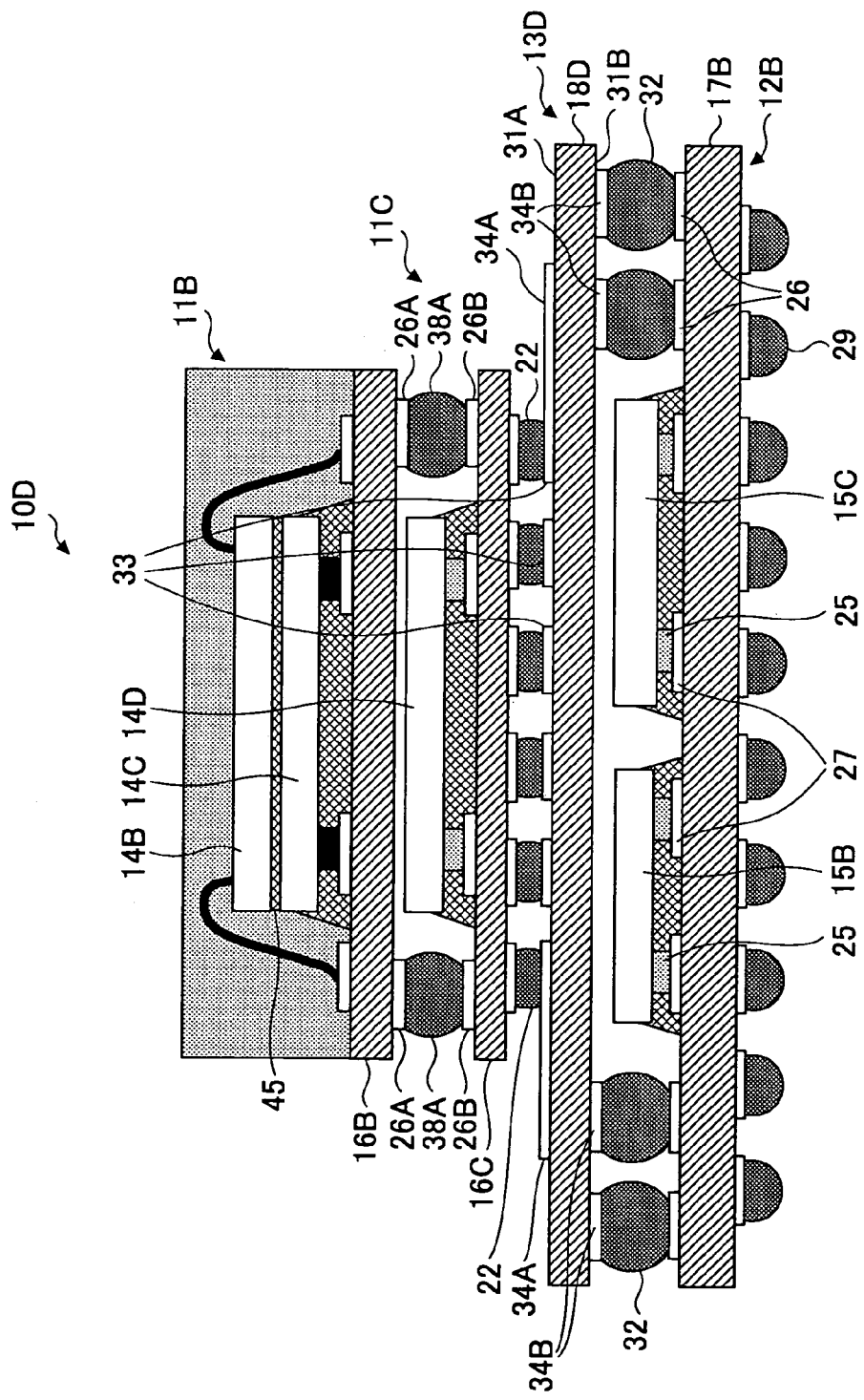
FIG. 4 is a cross-sectional view of the semiconductor device according to a fourth embodiment of the present invention.

FIG. 4 shows a semiconductor device 10D according to the fourth embodiment of the present invention. The semiconductor device 10D of the present embodiment is characterized by two or more upper device units 11B and 11C being stacked on an interposer substrate 13D.

The upper device unit 11B located in the topmost part includes a semiconductor element 14B and a semiconductor element 14C on a first wiring substrate 16B. The semiconductor element 14C is flip chip bonded to the first wiring substrate 16B, and the semiconductor element 14B is adhesively fixed to the semiconductor element 14C by an adhesive 45 with its face up. Further, the semiconductor element 14B is electrically connected to the first wiring substrate 16B by wires. Furthermore, connection electrodes 26A are formed on the undersurface of the first wiring substrate 16B, that is, on the surface that faces the upper device unit 11C.

The upper device unit 11C is arranged below the upper device unit 11B. The upper device unit 11C includes a semiconductor element 14D, and a first wiring substrate 16C to which the semiconductor element 14D is flip chip bonded. Further, the external connection terminals 22 are formed on the first wiring substrate 16C, facing the interposer substrate 13D. Furthermore, connection electrodes 26B are formed on the upper surface of the first wiring substrate 16C, the upper surface facing the upper device unit 11B.

The upper device unit 11B and the upper device unit 11C are electrically connected by stacking bumps 38A that connect the connection electrodes 26A formed on the first wiring substrate 16B of the upper device unit 11B and the connection electrodes 26B formed on the first wiring substrate 16C of the upper device unit 11C.

On the other hand, the lower device unit 12B includes two semiconductor devices 15B and 15C in the present embodiment. The bumps 25 are formed on each of the semiconductor devices 15B and 15C, which devices are flip chip bonded with the bumps 25 being connected to the bump connecting electrodes 27 formed on the second wiring substrate 17B.

The second conductive members 33 and the third conductive members 34A are formed on the upper surface 31A of the interposer substrate 13D, and the third conductive members 34B, to which the first conductive members 32 are bonded, are formed on the undersurface 31B of the interposer substrate 13D. The third conductive members 34A and the third conductive members 34B are electrically connected by vias that are formed through a circuit board 18D of the interposer substrate 13D.

As described above, the semiconductor device 10D of the present embodiment includes the two upper device units 11B and 11C stacked and mounted on the interposer substrate 13D. In this manner, the semiconductor device 10D can provide further advanced features and multiple functions.

Further, the number of the upper device units that are stacked is not limited to two as in the present embodiment, and three or more upper device units may be stacked. Electrical connections between upper device units, and electrical connections between each upper device unit and the interposer substrate 13D can be carried out by flip chip bonding, TAB connection, wire connection, etc. Further, in each upper device unit, the semiconductor device can be mounted on either or both of the upper surfaces and the undersurface of the first wiring substrate.

Next, the fifth embodiment of the present invention is explained.

Figure 5:
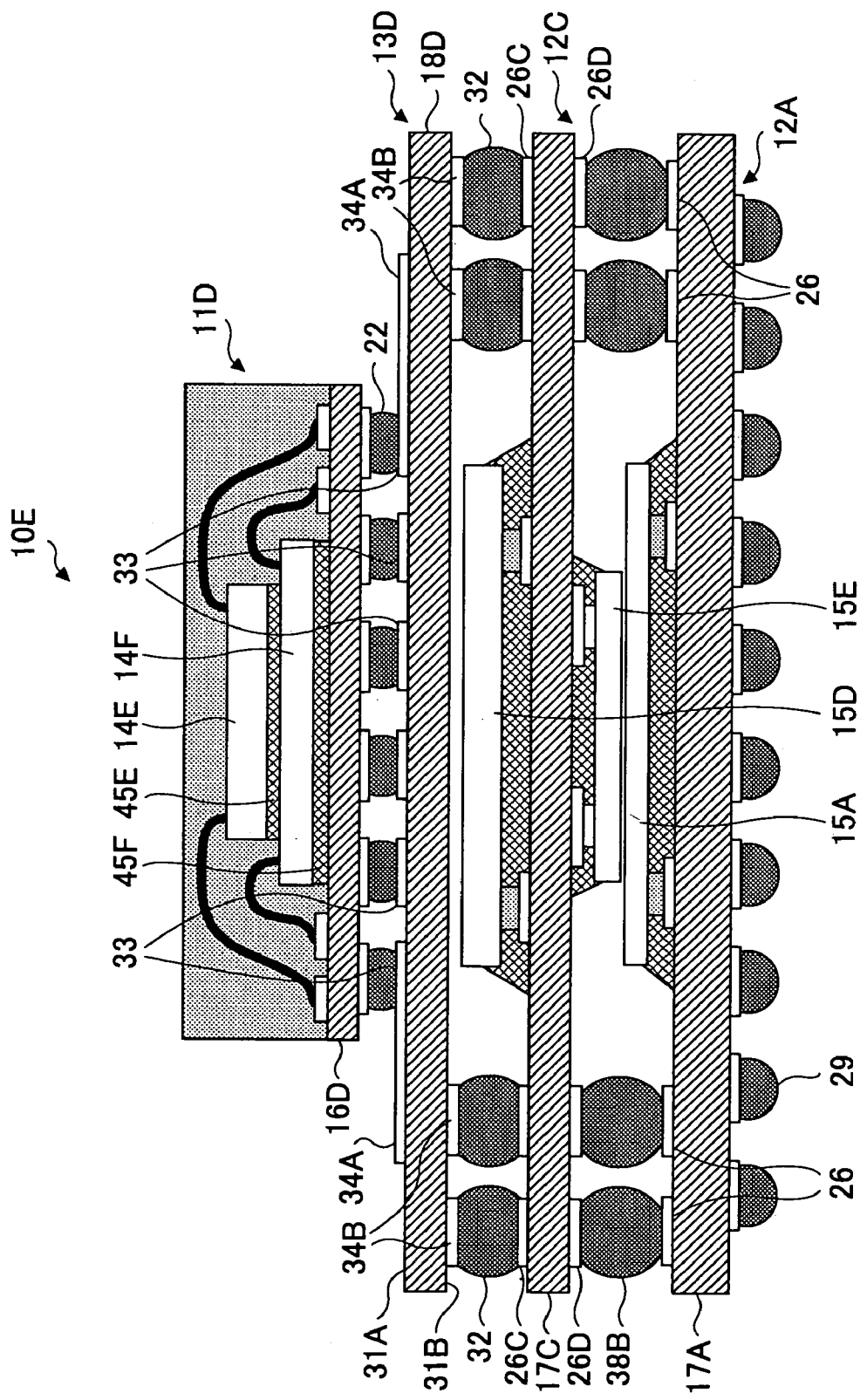
FIG. 5 is a cross-sectional view of the semiconductor device according to a fifth embodiment of the present invention.

FIG. 5 shows a semiconductor device 10E according to the fifth embodiment of the present invention. The semiconductor device 10E is characterized by two or more lower device units 12A and 12C being mounted below an interposer substrate 13D.

The lower device unit 12A located at the bottom part is the same as the lower device unit 12A of the semiconductor device 10A according to the first embodiment as shown in FIG. 1. The lower device unit 12C is stacked on the lower device unit 12A.

A semiconductor element 15E is flip chip bonded on the undersurface of a second wiring substrate 17C of the lower device unit 12C, and a semiconductor element 15D is flip chip bonded on the upper surface of the second wiring substrate 17C. In this manner, the packaging density of the semiconductor devices 15D and 15E is increased. Further, the connection electrodes 26C are formed on the upper surface of the second wiring substrate 17C, and the connection electrodes 26D are formed on the undersurface of the second wiring substrate 17C.

The lower device unit 12A and the lower device unit 12C are electrically connected by stacking bumps 38B that connect the connection electrodes 26D formed on the second wiring substrate 17C and the connection electrodes 26 formed on the second wiring substrate 17A. Further, the interposer substrate 13D and the lower device unit 12C are electrically connected by the first conductive members 32 that connect the third conductive member 34B formed on the undersurface 31B of the circuit board 18D and the connection electrodes 26C formed on the second wiring substrate 17C.

On the other hand, the upper device unit 11D of the present embodiment includes a semiconductor element 14E and a semiconductor element 14F that are stacked on a first wiring substrate 16D. The semiconductor element 14F is adhesively fixed by an adhesive 45F with its face up to the upper surface of the first wiring substrate 16D, and the semiconductor element 14E is adhesively fixed by an adhesive 45E with its face up on the top of the semiconductor element 14F.

The semiconductor devices 14E and 14F are electrically connected to the first wiring substrate 16D by wires. In addition, the interposer substrate 13D is the same as the interposer substrate 13D of the fourth embodiment shown in FIG. 4.

As described above, the semiconductor device 10E of the present embodiment includes the two lower device units 12A and 12C that are stacked below the interposer substrate 13D. In this manner, the semiconductor device 10E is capable of offering advanced features and multiple functions.

Further, the number of the lower device units that are stacked is not limited to two as in the present embodiment, and the number can be three or greater, where electrical connections between the lower device units, and the electrical connections between each lower device unit and the interposer substrate 13D can be selected from flip chip bonding, TAB connection, wire connection, etc. Further, in each lower device unit, a semiconductor device can be mounted on either or both of the upper surface and the undersurface of the second wiring substrate 17C.

In addition, although the present embodiment employs a multilayer substrate with inner layer wiring as the interposer substrate 13D, a single surface wiring substrate and a double surface wiring substrate may be employed as shown in the embodiments described above.

Next, the sixth embodiment of the present invention is explained.

Figure 6:
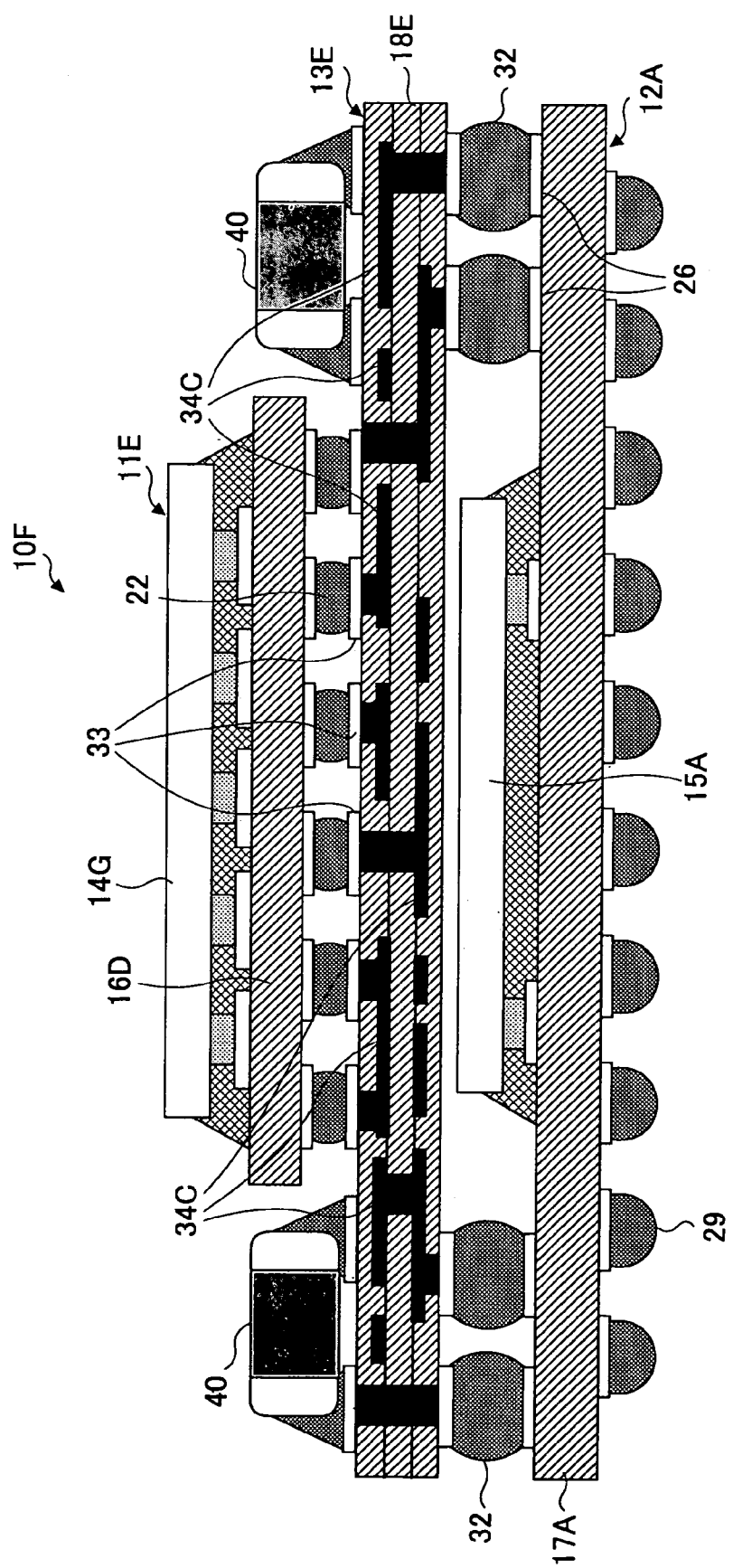
FIG. 6 is a cross-sectional view of the semiconductor device according to a sixth embodiment of the present invention.

FIG. 6 shows a semiconductor device 10F according to the sixth embodiment of the present invention. The semiconductor device 10F is characterized by including passive components 40 mounted on a circuit board 18E that is a multilayered substrate constituting an interposer substrate 13E.

The circuit board 18E of the interposer substrate 13E includes third conductive members 34C serving as an inner layer wiring. The third conductive members 34C are electrically connected to the first conductive members 32 and the second conductive members 33.

Further, according to the present embodiment, an upper device unit 11E that is mounted on the circuit board 18E by flip chip bonding includes a first wiring substrate 16D on which a semiconductor element 14G is mounted.

Furthermore, in the present embodiment, the passive components 40 are mounted on the upper surface of the interposer substrate 13E. The passive components 40 are small electronic parts, such as a chip capacitor and a chip resistor. In the present embodiment, the passive components 40 are soldered to the upper surface of the interposer substrate 13E.

Since the semiconductor device 10F of the present embodiment employs the multilayered substrate as the interposer substrate 13E, the third conductive members 34C, serving as the inner layer wiring, can be densely arranged.

Further, since the inner layer wiring (served by the third conductive members 34C) is formed inside the interposer substrate 13E, the interposer substrate 13E has high rigidity compared with a single surface wiring substrate and a double surface wiring substrate, suppressing curvature and deformation due to temperature change occurring in the interposer substrate 13E, and, therefore, the reliability of the semiconductor device 10F is enhanced.

Further, since the semiconductor device 10F of the present embodiment includes the passive components 40 mounted on the interposer substrate 13E, an RF device having desired electrical properties can be provided.

Although the present embodiment is described as an example using a multilayer substrate with inner layer wiring as the interposer substrate 13E, a single surface monolayer wiring substrate, and a double surface monolayer wiring substrate can also be used as described above.

Next, the seventh embodiment of the present invention is explained.

Figure 7:
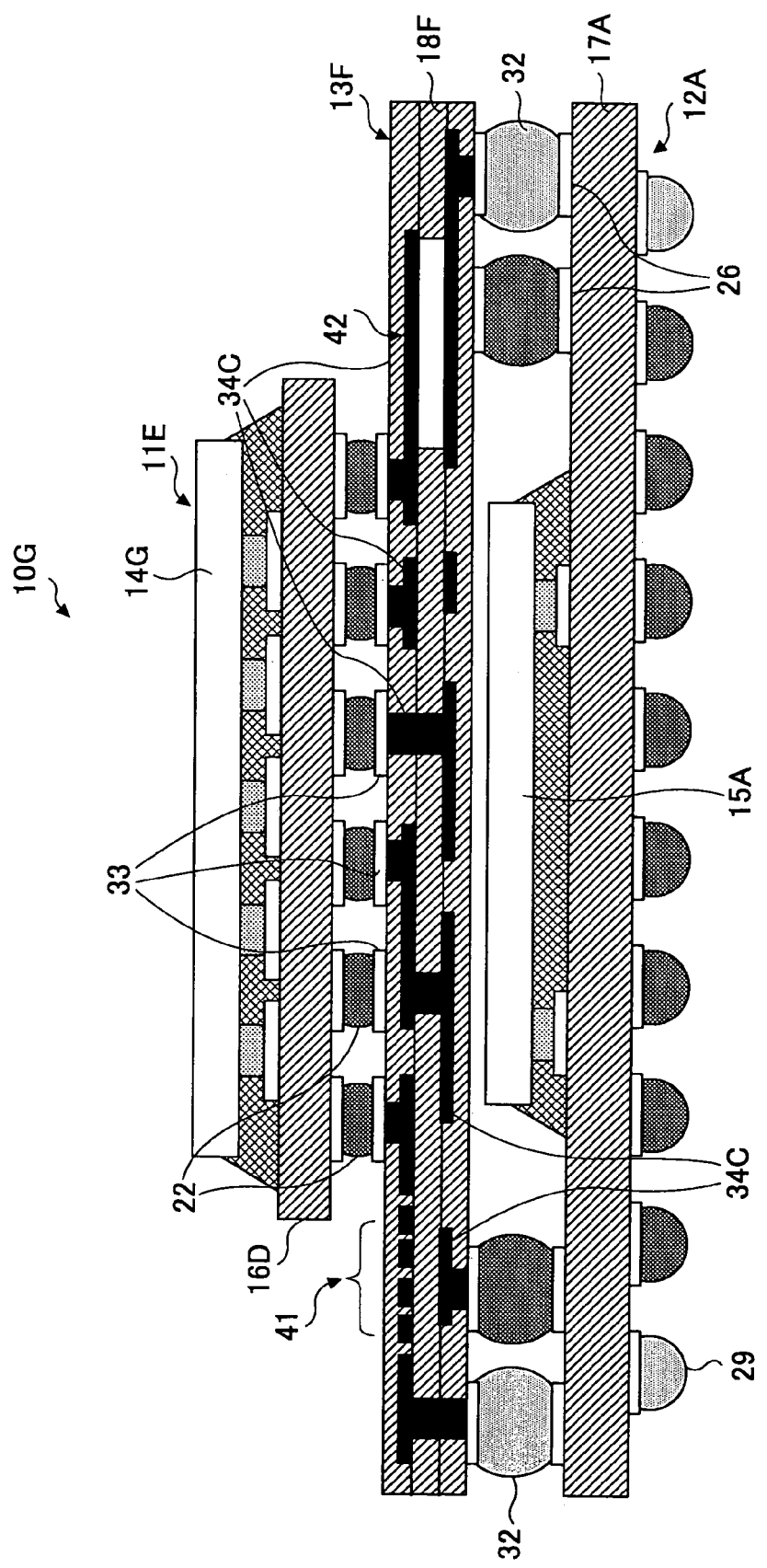
FIG. 7 is a cross-sectional view of the semiconductor device according to a seventh embodiment of the present invention.

FIG. 7 shows a semiconductor device 10G according to the seventh embodiment of the present invention. In the semiconductor device 10F according to the sixth embodiment explained using FIG. 6, the passive components 40 are prepared separately from the circuit board 18E, and mounted on the interposer substrate 13E by soldering.

Here, in the case of the present embodiment, the semiconductor device 10G includes an interposer substrate 13F that is multilayered and includes the third conductive members 34C and a circuit board 18F. The circuit board 18F includes an inductor section 41 and a capacitor section 42 that serve as passive components constituted by inner layer wiring.

Although the passive components are formed by inner layer wiring according to the present embodiment, the passive components may be structured in other manners, such as embedding independent passive components in the multilayered substrate, with the independent passive components being wire-connected to the inner layer wiring.

According to the semiconductor device 10G of the present embodiment, the passive components 41 and 42 are incorporated into the interposer substrate 13F by forming the inductor section 41 and the capacitor section 42 as inner layer wiring of the circuit board 18F that is a multilayer substrate. In this manner, no passive components independent from the circuit board 18F need to be prepared, reducing the number of components to be mounted, and reducing manufacturing cost.

As described above, the present invention provides semiconductor devices that offer various effects and advantages as follows.

Since the stacked semiconductor device of the present invention uses general-purpose semiconductor device units, external connection terminals arrangement of which are beforehand given, design flexibility is improved, and a system device served by multiple semiconductor devices can be easily realized. In this manner, the requirements for advanced features and multiple functions are satisfied.

Further, since tests are simplified by incorporating the general-purpose semiconductor devices whose quality is guaranteed, manufacturing cost is reduced, and the manufacturing yield is raised.

Further, according to the present invention, solder bumps are used as the first conductive members, and a simple and low cost stacking structure is realized.

Further, since the distance between the first semiconductor device unit and the third wiring substrate is reduced by the height corresponding to the amount of the external connection terminals that melt and fill the through holes, the stacked semiconductor device of the present invention is made thin.

Further, since the present invention also provides a stacked semiconductor device with a multi-layer substrate, the third conductive members can provide a complicated circuit pattern, compared with a configuration wherein the third conductive members are formed only on one surface, and, therefore, the design flexibility of the semiconductor device is improved. Further, since the rigidity of the third wiring substrate is increased, curvature and deformation of the substrate occurring due to temperature change is suppressed, enhancing the reliability of the semiconductor device.

Further, the present invention also provides a stacked semiconductor device that is capable of providing advanced features and multiple functions.

Further, the present invention provides a stacked semiconductor device with a higher-density wiring substrate by using a multilayered substrate as the third wiring substrate. Further, since rigidity of the multilayered substrate is increased compared with a single surface wiring substrate and a double surface wiring substrate, curvature and deformation of the third wiring substrate occurring due to temperature change is suppressed, and the manufacturing yield is raised.

Further, according to the present invention, since passive components are mounted on the third wiring substrate, a semiconductor device suitably serving as an RF device can be constituted.

Further, according to the present invention, passive components are incorporated in the third wiring substrate, thereby dispensing with independent passive components, reducing the manufacturing cost.

Further, the present invention is not limited to these embodiments, but various variations and modifications may be made without departing from the scope of the present invention.

The present application is based on Japanese priority application No. 2003-065392 filed on Mar. 11, 2003 with the Japanese Patent Office, the entire contents of that are hereby incorporated by reference.

What is claimed is:

1. A stacked semiconductor device, comprising:
a first semiconductor device unit comprising a first wiring substrate, at least one semiconductor device mounted on said first wiring substrate, and a first external connection terminal provided at a surface opposite to a surface where said semiconductor device is mounted of said first wiring substrate and a position facing a position at which said semiconductor device is mounted, and in the vicinity of said position facing said position at which said semiconductor device is mounted,
a second wiring substrate that is prepared below said first semiconductor device unit,
a second semiconductor device unit comprising at least one semiconductor device that is mounted on said second wiring substrate, and a connection electrode formed on a surface of said second wiring substrate, said surface facing said first semiconductor device unit,
a third wiring, comprising a circuit board of said third wiring substrate arranged between said first semiconductor device unit and said second semiconductor device unit, a first conductive member for electrically connecting said circuit board and said connection electrode, a second conductive member that is formed corresponding to a form position of said first external connection terminal, said second conductive member being electrically connected to said first external connection terminal, and a third conductive member for electrically connecting said first conductive member and said second conductive member.

2. The stacked semiconductor device as claimed in claim 1, wherein said first conductive member is formed by a solder bump that is connected to said third conductive member, said solder bump penetrating said circuit board.

3. The stacked semiconductor device as claimed in claim 1, wherein:
a solder bump constitutes said first conductive member,
said second conductive member and said third conductive member are formed on a surface of said third wiring substrate, said surface facing said second semiconductor device unit, and
said first external connection terminal is electrically connected to said second conductive member through a through hole formed in said third wiring substrate.

4. The stacked semiconductor device as claimed in claim 1, wherein:
said second conductive member is formed on a surface facing said first semiconductor device unit of said third wiring substrate;
and said third conductive member is formed on both surfaces of said third wiring substrate, one of said surfaces facing said first semiconductor device unit, and the other facing said second semiconductor device unit, and
said third conductive member formed on said both surfaces is electrically connected to said circuit board by a through-hole electrode formed by penetrating said circuit board.

5. The stacked semiconductor device as claimed in claim 1, wherein two or more said first semiconductor device units are stacked.

6. The stacked semiconductor device as claimed in claim 1, wherein two or more said second semiconductor devices are stacked.

7. The stacked semiconductor device as claimed in claim 1, wherein said third wiring substrate comprises a multilayered substrate.

8. The stacked semiconductor device as claimed in claim 1,
wherein a passive component is mounted on said third wiring substrate so as to be put side by side with said first semiconductor device unit.

9. The stacked semiconductor device as claimed in claim 1, wherein arrangement of said first external connection tenninals of said first semiconductor device unit is different from arrangement of said connection electrode formed on said second wiring substrate,
said third wiring substrate comprises a multilayered substrate, and a passive component is formed inside said multilayered substrate.

* * * * *